US006172506B1

(12) United States Patent
Adderton et al.

(10) Patent No.: US 6,172,506 B1
(45) Date of Patent: Jan. 9, 2001

(54) CAPACITANCE ATOMIC FORCE MICROSCOPES AND METHODS OF OPERATING SUCH MICROSCOPES

(75) Inventors: Dennis M. Adderton; Virgil B. Elings, both of Santa Barbara, CA (US)

(73) Assignee: Veeco Instruments Inc., Plainview, NY (US)

( * ) Notice: Under 35 U.S.C. 154(b), the term of this patent shall be extended for 0 days.

(21) Appl. No.: 08/892,746

(22) Filed: Jul. 15, 1997

(51) Int. Cl.[7] ..... G01R 29/12

(52) U.S. Cl. ..... 324/458; 324/662; 73/105; 250/307

(58) Field of Search ..... 324/662, 663, 324/671, 689, 762, 765, 158.1, 458; 250/306, 307, 311; 73/105

(56) References Cited

U.S. PATENT DOCUMENTS

| | | | | |
|---|---|---|---|---|
| Re. 32,457 | | 7/1987 | Matey | 324/662 |
| 4,883,959 | * | 11/1989 | Hosoki et al. | 250/306 |
| 5,065,103 | | 11/1991 | Slinkman et al. | 324/158.1 |
| 5,266,801 | | 11/1993 | Elings et al. | 250/306 |
| 5,267,471 | * | 12/1993 | Abraham et al. | 72/105 |
| 5,283,442 | * | 2/1994 | Martin et al. | 250/307 |
| 5,400,647 | | 3/1995 | Elings | 73/105 |
| 5,412,980 | | 5/1995 | Elings et al. | 73/105 |
| 5,415,027 | | 5/1995 | Elings et al. | 73/105 |
| 5,418,771 | * | 5/1995 | Kasanuki et al. | 250/307 |
| 5,436,448 | * | 7/1995 | Hosaka et al. | 250/306 |
| 5,481,527 | * | 1/1996 | Kasanuki et al. | 250/306 |
| 5,523,700 | | 6/1996 | Williams et al. | 324/765 |
| 5,700,953 | * | 12/1997 | Hlady et al. | 73/105 |

OTHER PUBLICATIONS

"Scanning Capacitance Microscopy," Article by J.R. Matey & J. Blanc (RCA Labs., Princeton, N.J. 08540); published in J. Appl. Phys. 57 (5), Mar. 1, 1985, pp. 1437–1444.

"Lateral Dopant Profiling on a 100 nm Scale by Scanning Capacitance Microscopy," Article by C.C. Williams, J. Slinkman, et al., publ. in J. Vac. Sci. Technol. A8(2), Mar./Apr. 1990, pp. 895–898.

"Quantitative Two–Dimensional Dopant Profile Measurement and Inverse Modeling by Scanning Capacitance Microscopy," Article by Y. Huang, C.C. Williams; publ. in Appl. Phys. Lett. 6(3), Jan. 16, 1995, pp. 344–346.

"Characterization of Two–Dimensional Dopant Profiles: Status and Review," Article by A.C. Diebold/M.R. Kump; publ. in J. Vac. Sci. Technol. B 14(1), Jan./Feb. '96, pp. 196–201.

"Tapping Mode Capacitance Microscopy," Article by Kazuya Goto/Kazuhiro Hane; publ. in Rev. Sci. Instrum. 68(1), Jan. '97, pp. 120–123.

* cited by examiner

*Primary Examiner*—Safet Metjahic
*Assistant Examiner*—Vincent Q Nguyen
(74) *Attorney, Agent, or Firm*—Patrick F. Bright

(57) ABSTRACT

A surface of the sample is scanned in intermittent contact mode with an the AFM. The probe tip is electrically conductive and is electrically connected to a capacitance sensing circuit. The oscillation of the AFM probe modulates capacitance between probe tip and sample surface. The modulated capacitance is demodulated to yield the capacitance properties of the sample.

12 Claims, 3 Drawing Sheets

LOCK-IN AMPLIFIER (DEMODULATION)
DHF CAPACITANCE SENSOR
V BIAS (COULD BE 0)
CONTROL AND COMPUTER
XYZ ACTUATOR
LIP OSCILLATOR
SAMPLE
CHUCK
DISPLAY
1
2
3
4
5
7
8
9
10
11
12
13
14
15

FIG. 2
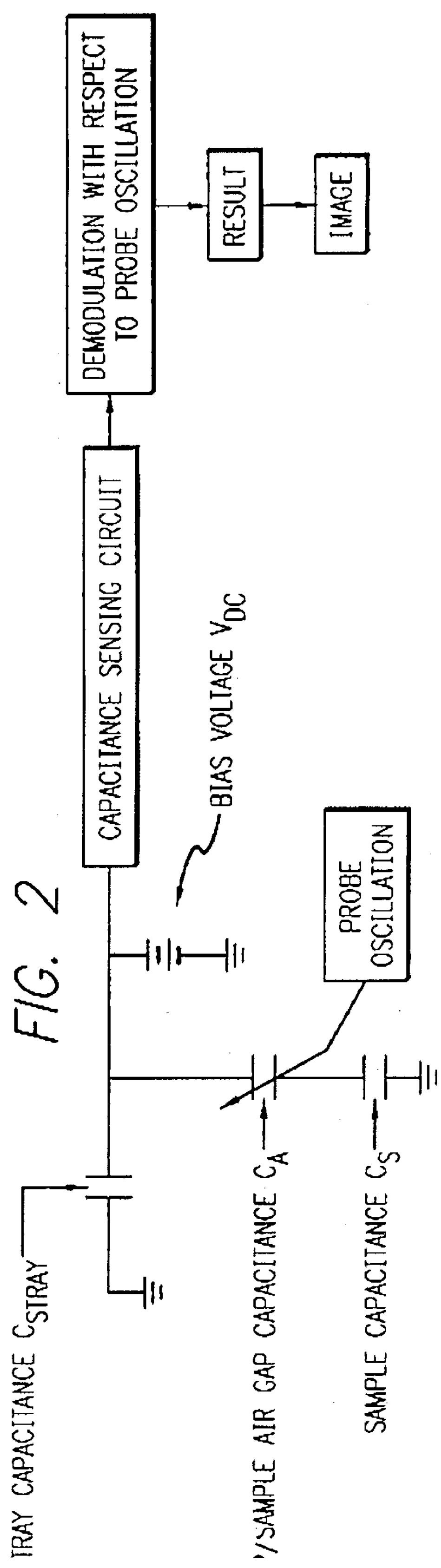
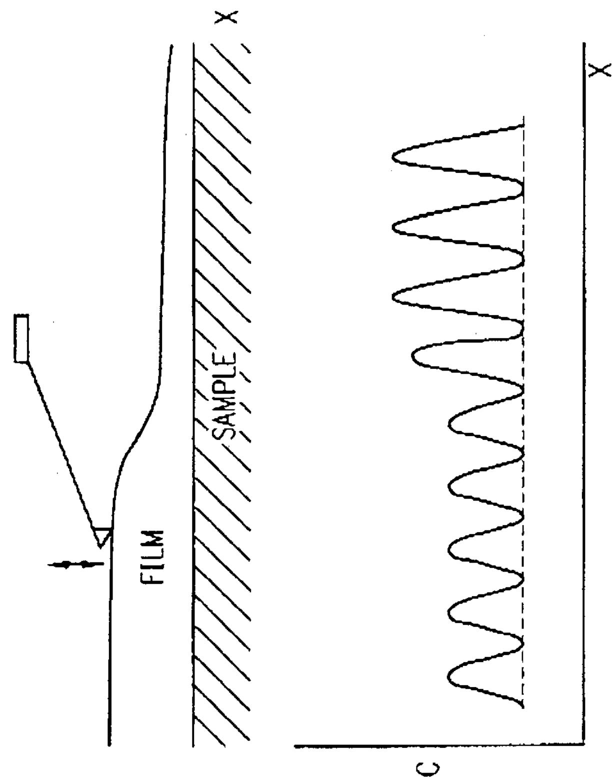
FIG. 3

CAPACITANCE ATOMIC FORCE MICROSCOPES AND METHODS OF OPERATING SUCH MICROSCOPES

The present invention relates to new atomic force microscopes (AFMs), and to methods for operating such AFMs in intermittent contact mode to scan samples for electrical properties such as dopant profiles or film thickness.

AFMs are high-resolution, surface-measuring and surface-modifying instruments. There are three general modes of operation for AFMs: the contact mode (repulsive mode), the non-contact (attractive mode), and the intermittent contact mode.

In the intermittent contact or "tapping" mode of AFM operation, as described in detail in U.S. Pat. Nos. 4,966,801; 5,412,980; and 5,415,027 by Elings et al., a probe tip on a cantilever is oscillated and scanned across the surface of samples in intermittent contact with the samples. In this mode of operation, the amplitude of probe oscillation may be kept constant through feedback which servos the relative vertical position of the cantilever mount to the sample, or vice versa, so that the probe follows the topography of the sample surface. The probe's oscillation amplitude is preferably greater than 20 nm to maintain the energy in the lever arm much higher than the energy lost when the probe touches sample surfaces. Oscillation at such amplitudes also minimizes the sticking of the probe tip to sample surfaces. Sample height data is obtained from the Z actuator control signal that maintains the established amplitude setpoint, or from a vertical motion sensor.

The methods of this invention comprise operating AFMs in intermittent contact mode to measure, scan or modify the topography of sample surfaces wherein an error signal for tracking sample surfaces is the difference between an amplitude setpoint and a signal corresponding to the oscillation amplitude of the AFM probe as the probe tip makes intermittent contact with, or taps, the sample surfaces.

Oscillation of the AFM probe modulates the capacitance of the tip-sample system, at the frequency of the tapping. The amplitude of the capacitance modulation signal results from the electrical series combination of the modulated air gap capacitance, i.e. the capacitance between the tip and sample, and the substantially unmodulated capacitance of the sample surface, i.e. the sample capacitance. As the air gap between the tip and sample becomes larger, the air gap capacitance approaches zero, making the series capacitance approach zero. As the distance between the tip and sample varies, the detected capacitance also varies. This capacitance varies between the air gap capacitance ("$C_A$"), when the tip is far off the surface, and the tip-sample capacitance, when the tip touches the surface of the sample.

In these AFMs, the probe and the probe tip are conductive, and are electrically connected to a capacitance sensing circuit. As the probe tip is scanned over the sample surface, the capacitance sensing circuit generates a signal corresponding to the capacitance of the tip-air gap-sample system.

Preferred embodiments of these capacitance sensing circuits include an RCA®-style capacitance sensor. In such sensors, a UHF oscillator inductively drives a resonant circuit near its resonant frequency. The conductive AFM probe is electrically connected to this resonant circuit by way of a transmission line. Changes in tip-sample capacitance modify the resonant frequency of this circuit, and thereby change the amplitude of the oscillator signal induced in the circuit. The amplitude of the signal is detected and outputted from the capacitance sensing circuit as a signal corresponding to the tip-sample capacitance, plus any parasitic capacitance. Other types of capacitive sensors, e.g. capacitive bridge circuits and impedance transformers, may also be used.

The signal amplitudes are demodulated, preferably at the frequency of the probe tip oscillation, or tapping, producing signals corresponding to the oscillation amplitude of the tip-sample capacitance. Alternatively, modulation at harmonics of the oscillation, or mixing of multiple oscillation frequencies, may be used. The demodulated capacitance signals may be stored, and may also be displayed as an image representative of the tip-sample capacitance as it varies across the sample surfaces. Such images may, for example, represent variations in carrier or impurity concentrations across semiconductor samples, or variations in the capacitance across a dielectric layer on the surface of a semiconductor sample or a conductor sample. Variations in dielectric capacitance may correspond to intrinsic properties such as trapped charge or dielectric constant or variation in thickness.

These new AFMs have many advantages. These AFMs measure capacitance (C) of samples directly. Their intermittent contact mode of operation provides better performance in topographical measurement than contact or non-contact modes. The intermittent contact mode of operation reduces friction between the tip and sample, facilitating capacitance measurements on samples with minimal damage to samples or probe tip. Capacitance of thin films may be measured over conductive and semiconductive samples. No bias need be applied between the probe tip and sample, so the tip does not short out to conducting surfaces, although a bias voltage can be used to make measurements at various bias voltages.

BRIEF DESCRIPTION OF THE DRAWINGS

This invention and some of its advantages can better be understood by reference to the following detailed description, considered in connection with the accompanying drawings, wherein:

FIG. 2 is a simplified functional diagram illustrating a theory of operation of this invention;

FIG. 3 is a simplified diagram of the correspondence between the modulation of the capacitance and the thickness of an insulator film on a sample.

DETAILED DESCRIPTION OF THE PREFERRED EMBODIMENTS

Figure 1:
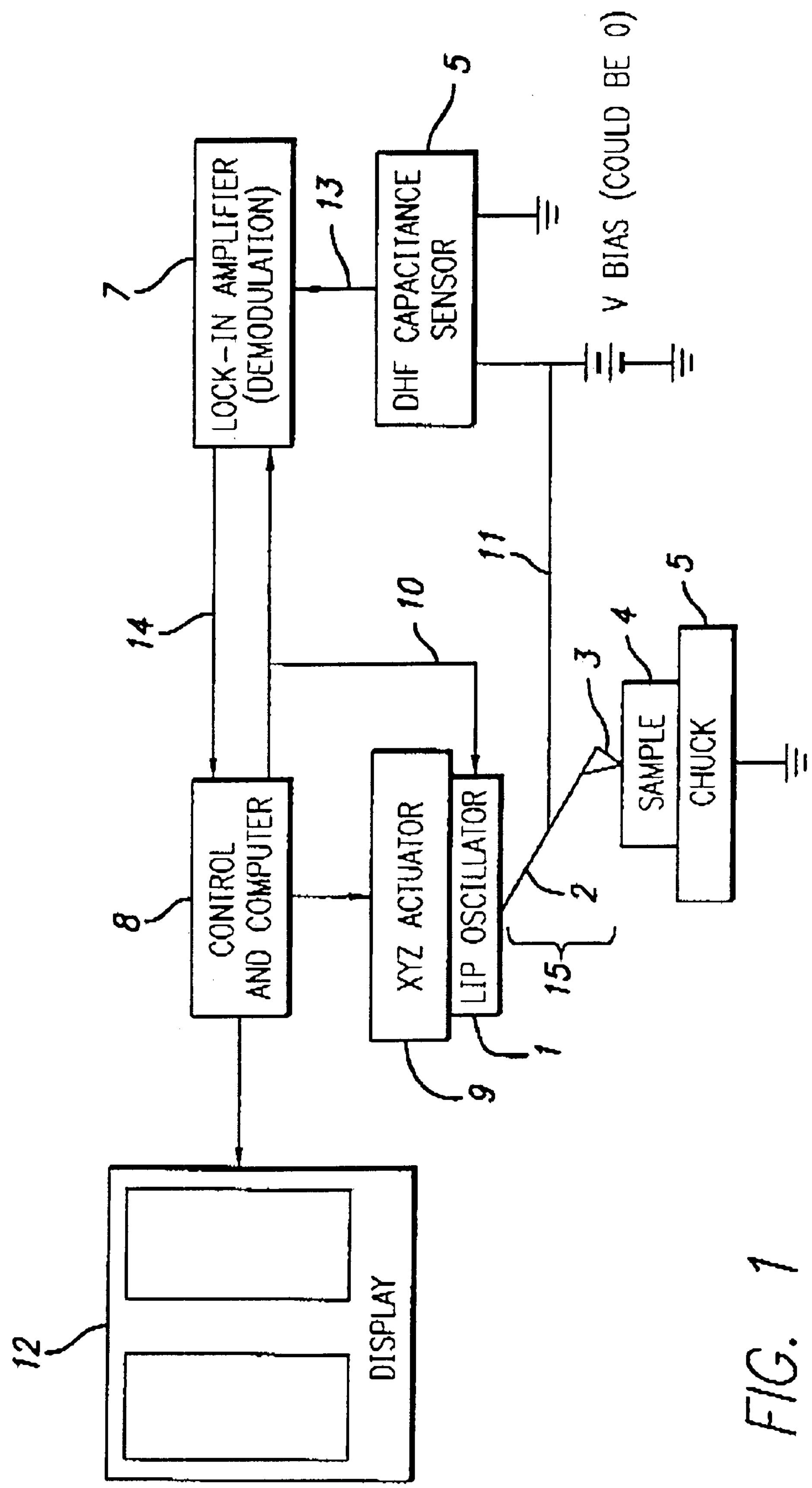
FIG. 1 is a simplified functional block diagram of an atomic force microscopes of this invention.

FIG. 1 shows an AFM including probe tip oscillator 1 that oscillates cantilever 2 and conductive probe tip 3 (collectively "probe 15"). Probe 15 may be magnetic, and can be oscillated by a magnetic actuator. Probe 15 moves toward and away from the surface of sample 4 in oscillatory motion, preferably at or near a resonant frequency of probe 15. Conductive probe tip 3 is electrically connected to UHF capacitance sensor 6 via path 11. From sensor 6, modulated capacitance signals, corresponding to variations in the tip-sample system capacitance, pass on path 13 to lock-in amplifier 7.

Preferably, capacitance sensor 6 is a UHF-resonant circuit that senses the capacitance between conductive tip 3 and sample 4. Alternatively, a capacitive bridge circuit or an impedance transformer may be used instead of sensor 6.

Lock-in amplifier 7 demodulates the capacitance signals at the oscillation frequency, or at some combination of frequency oscillation harmonics, of probe 15, resulting in signals that correspond to the modulation amplitude of the tip-sample capacitance. These signals pass on path 14 to control and computer 8.

Alternatives to lock-in amplifier 7 are band pass filters with amplitude detection. Lock-in amplifier 7 or such band pass filters may be digital or analog.

Signals on path 14 pass into AFM computer control electronics 8 to be stored for each data point with respect to X and Y position on sample 4. Such data may also be passed to display device 12 for display as an image of sample capacitance(s) on or across sample 4. This display could also show, simultaneously or otherwise, a topographic image of sample 4 obtained from the motion of probe 15.

XYZ actuator 9 is shown to move probe 15 relative to sample 4, but sample 4 may be moved relative to probe 15. In addition, sample 4 may be moved relative to probe 15 in any or all of the X, Y or Z (height) directions. In other words, though XYZ actuator position control 9 is shown in FIG. 1 to control all three directions of relative movement, probe 15 may be stationary, and sample 4 moved in any or all of these directions. For example, sample 4 may be moved in the X and Y directions relative to the probe, and probe 15 may be moved in the Z direction relative to sample 4. The XYZ data can also be displayed as sample topography.

FIG. 2 illustrates the relationship of sample capacitance to the modulation of the air gap capacitance caused by oscillation of a probe. Probe oscillation modulates the air gap capacitance ("$C_A$"). The sample capacitance ("$C_S$") appears in series with the air gap capacitance as seen by the capacitance sensing circuit. The total capacitance ("$C_{TS}$") as seen by the capacitance sensing circuit is expressed as: $C_{TS}=(C_S \times C_A)/(C_S+C_A)+C_{STRAY}$, where $C_{STRAY}$ is the stray capacitance of the system. The modulated amplitude of $C_A$ is maintained substantially constant across the sample surface. Thus, for example, an image of the change in $C_{TS}$ represents variations in $C_S$ across a sample surface.

As FIG. 2 in combination with FIG. 1 shows, a DC bias voltage may be applied between semiconductor sample 4 and conductive tip 3 of AFM probe 15 while probe 15 taps the sample surface in intermittent contact mode, to sense charge density in sample 4 at the same frequency as the tapping, or intermittent contact. The DC bias voltage may be used to create a field between sample 4 and conductive tip 3 which moves the local carriers as sample 4 and tip 3 approach each other. Because the measure of sample capacitance is the measure of a sample's ability to store charge, the more highly doped a semiconductor is, i.e. the higher the carrier density, the greater the measured $C_S$.

If the C is measured over a thin film of dielectric material, then the gap between the tip and the sample is the film thickness plus the air gap between the tip and film. If the sample substrate conductivity were substantially constant over an area, the variations in the modulated capacitance across the sample would be due only to variations of film thickness or dielectric constant across the sample, and could be measured by this microscope, as shown in FIG. 3. As shown in FIG. 3, the modulation of the capacitance will be larger in regions where the film is thinner, giving a larger tip-sample capacitance when the tip is on the film.

Figure 4:
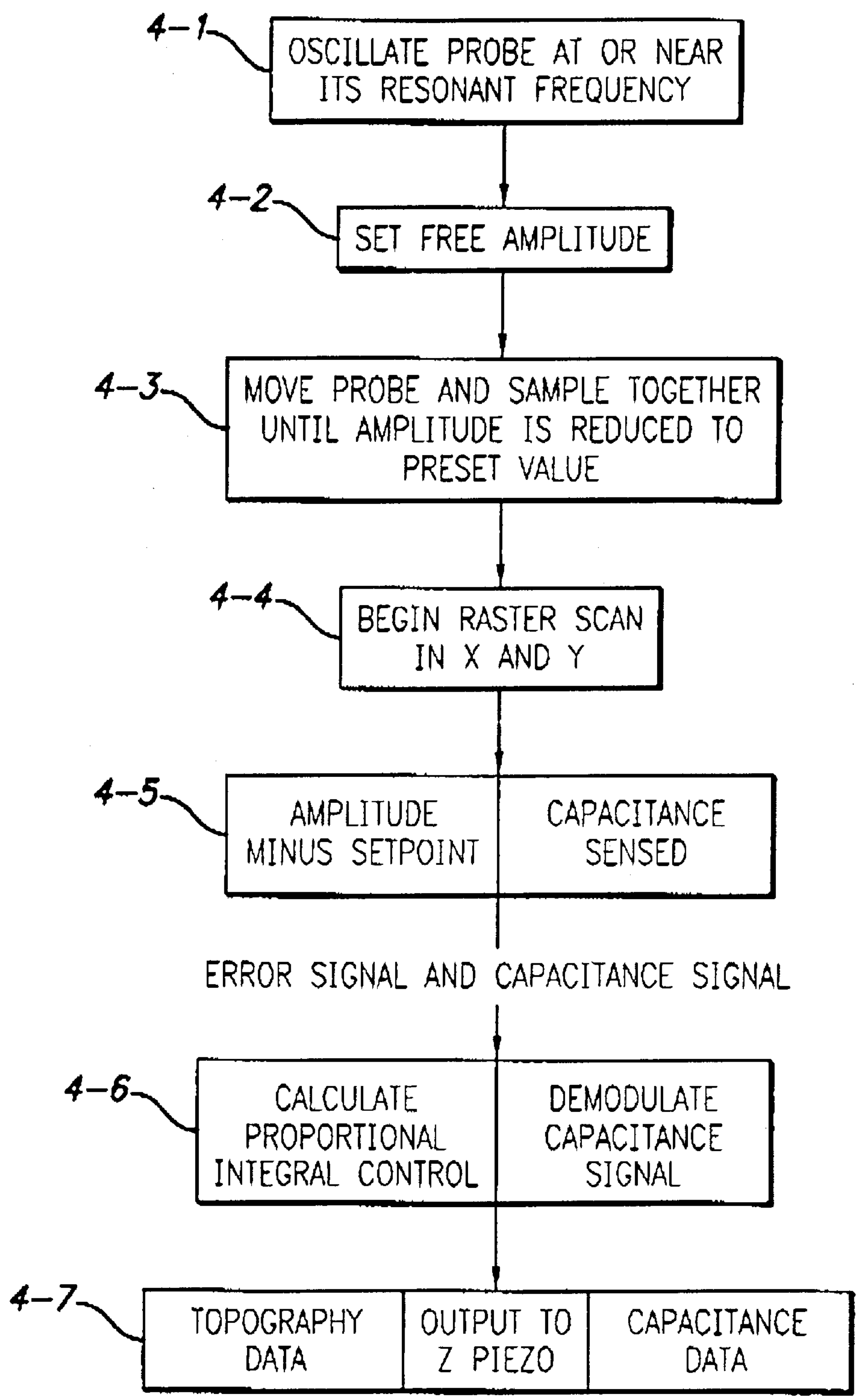
FIG. 4 is a flow chart representing the simultaneous measurement of topography and capacitance using the atomic force microscopes of this invention.

FIG. 4 is a flow chart representing the simultaneous measurement of topography and capacitance when operating the atomic force microscope of the invention. Oscillator 1 oscillates probe 15 at or near its fundamental resonant frequency or at a higher resonance thereof (step 4-1). In step 4-2, the resonant free oscillation amplitude of probe 15 is determined and set. In step 4-3, probe 15 and sample 4 are moved together, preferably by operation of the XYZ actuator 9, until the amplitude of the oscillations of probe 15 is reduced to a preset value, called a setpoint. XYZ actuator 9 then begins scanning the probe across the surface of sample 4 in a raster pattern in the X-Y plane (step 4-4). (Steps 4-3 and 4-4 could take place in reverse order.) In step 4-5, the oscillation amplitude error (amplitude-setpoint=error) is calculated and fed back into a proportional and integral control calculation. If the amplitude of oscillation of probe 15 is too large or too small, cantilever 2 and sample 4 are moved, together or apart, to maintain the oscillation amplitude essentially constant at the setpoint (4-6). Simultaneously, in step 4-5, the capacitance is sensed by UHF capacitance sensor 6. In step 4-6, the capacitance signal is demodulated.

Finally, a control signal is output to the Z portion of XYZ actuator 9 piezo, and topography data and capacitance data are produced (step 4-7). The sensitivity of the correction is, preferably, on the order of a few angstroms. The amplitude of oscillation of probe 15 as it taps tip 3 on sample 4 is kept constant in this way. The control signals are recorded in control/computer 8 as a function of the position of tip 3 in the X-Y plane. A substantially constant amplitude assists in the measurement of capacitance by maintaining a substantially constant $C_A$. The intermittent contact imaging process is described generally in U.S. Pat. No. 5,412,980 by Elings et al.

In this manner, both the topography of the surface of the sample and its capacitive characteristics are detected and, if desired, recorded. The amplitude of oscillation of probe 15 is usually greater than 20 nm to assure that the energy in probe 15 is higher than that lost in each cycle by striking the sample surface, thereby preventing the probe tip from sticking to the sample surface. Topographic data is obtained in this embodiment based on the control signal produced to maintain the oscillation amplitude at a constant value equal to the setpoint. Topographic data may also be detected and recorded directly as a function of changes in the amplitude of oscillation of probe 15, or from a separate Z sensor measuring the Z motion of the fixed end of cantilever 2.

Although the invention has been described with reference to particular embodiments, it is to be appreciated that various adaptations and modifications may be made and the invention is only to be limited by the appended claims.

What is claimed is:

1. A method of operating an atomic force microscope including a probe having an electrically-conductive probe tip provided at one end of a lever arm, the method comprising:

(a) oscillating said probe tip at or near a resonant frequency of said probe at an oscillation amplitude sufficiently great to repeatedly tap the surface of a sample without adhering to said surface of said sample;

(b) translating said oscillating conductive probe tip with respect to said surface of said sample;

(c) maintaining the amplitude of oscillation of said conductive probe tip at a desired amplitude setpoint during said translating step; and (d) detecting changes in capacitance between said tip and said sample.

2. The method of claim 1 further comprising producing a signal representative of said changes in capacitance.

3. The method of claim 2 further comprising applying a bias voltage between said conductive probe tip and said sample during said steps (a), (b) and (c).

4. The method of claim 1 further comprising producing a signal representative of sample topography.

5. The method of claim 2 further comprising producing a signal representative of sample topography.

6. The method of claim 3 further comprising producing a signal representative of sample topography.

7. An atomic force microscope comprising:

(a) a support for a sample;

(b) a probe comprising a cantilever and a conductive probe tip supported on a free end of said cantilever;

(c) an oscillator which is operatively coupled to said cantilever;

(d) a translator which is operatively coupled to at least one of said probe and said support;

(e) a capacitive sensor which is operatively coupled to said conductive probe tip;

(f) a demodulator which is operatively coupled to said sensor; and (g) a controller which is operatively coupled to said oscillator, to said actuator and to said demodulator, said controller being operable (1) to cause said oscillator to oscillate said probe such that said probe tip repeatedly contacts the sample of said surface, (2) to cause said translator to create relative motion between said sample and said probe, (3) to receive a signal from said demodulator, and (4) to correlate said signal from said demodulator with control of said translator.

8. The atomic force microscope of claim 7 wherein said controller is operable to maintain the amplitude of oscillation of said probe tip at a desired amplitude setpoint.

9. The atomic force microscope of claim 7 wherein said controller is operable to correlate vertical and horizontal relative motion between said sample and said probe.

10. The atomic force microscope of claim 8 wherein said controller is operable to correlate vertical and horizontal relative motion between said sample and said probe.

11. The atomic force microscope of claim 7 wherein said controller is operable to create an image of said signal from said demodulator as a function of translator position.

12. The method of claim 1 further comprising detecting changes in capacitance at the oscillation frequency of said probe tip.

* * * * *